(12) United States Patent
Li et al.

(10) Patent No.: US 11,558,985 B2
(45) Date of Patent: Jan. 17, 2023

(54) FREQUENCY CONVERTER

(71) Applicant: CHINA UNIVERSITY OF PETROLEUM BLUE SKY(QINGDAO) PETROLEUM TECHNOLOGY CO., LTD, Qingdao (CN)

(72) Inventors: Kaikai Li, Qingdao (CN); Huidong Lu, Qingdao (CN); Chuan Yan, Qingdao (CN); Enfang Xu, Qingdao (CN); Weizhong Wei, Qingdao (CN); Jiasheng Zhang, Qingdao (CN); Shouyuan Zhao, Qingdao (CN); Liuzhu Zhang, Qingdao (CN); Xinran Li, Qingdao (CN); Maofeng Yang, Qingdao (CN)

(73) Assignee: CHINA UNIVERSITY OF PETROLEUM BLUE SKY (QINGDAO) PETROLEUM TECHNOLOGY CO., LTD., Qingdao (CN)

( * ) Notice: Subject to any disclaimer, the term of this patent is extended or adjusted under 35 U.S.C. 154(b) by 26 days.

(21) Appl. No.: 17/126,046

(22) Filed: Dec. 18, 2020

(65) Prior Publication Data
US 2021/0195809 A1   Jun. 24, 2021

(30) Foreign Application Priority Data
Dec. 18, 2019 (CN) .......................... 201911317543.5

(51) Int. Cl.
H05K 7/20 (2006.01)
H05K 5/02 (2006.01)

(52) U.S. Cl.
CPC ....... *H05K 7/20909* (2013.01); *H05K 5/0217* (2013.01)

(58) Field of Classification Search
CPC .................... H05K 5/0217; H05K 7/20909
See application file for complete search history.

(56) References Cited

U.S. PATENT DOCUMENTS

| | | | | |
|---|---|---|---|---|
| 7,205,740 B1 * | 4/2007 | Wei | ................... | H05K 7/20945 318/434 |
| 2014/0036442 A1 * | 2/2014 | Giannoglou | ........... | H05K 7/186 361/695 |

(Continued)

FOREIGN PATENT DOCUMENTS

| | | | |
|---|---|---|---|
| CN | 207218518 U | * | 4/2018 |
| CN | 207911184 U | * | 9/2018 |

OTHER PUBLICATIONS

Zhu, Rong, "A Frequency Converter With High Radiating Performance", Apr. 10, 2018, Entire Document (translation of CN 207218518) (Year: 2018).*

(Continued)

*Primary Examiner* — Stephen S Sul
*Assistant Examiner* — Alexander Ryan Horton

(57) ABSTRACT

The present disclosure provides a frequency converter. The frequency converter includes a box body and a bottom box. A bottom portion of the box body is fixedly connected with a top portion of the bottom box. A top portion of a left side of the box body and a bottom portion of the left side of the box body are fixedly connected to a respective fan. A top portion of a left side of an inner wall of the box body and a top portion of the left side of the inner wall of the box body are fixedly connected to a respective annular plate. One end of an output shaft of each fan is fixedly connected to a rotating rod. One end of each rotating rod away from the fan passes through the box body and extends to an interior of the box body.

8 Claims, 4 Drawing Sheets

(56) References Cited

U.S. PATENT DOCUMENTS

2017/0172015 A1* 6/2017 Yu ...................... H05K 7/20909
2021/0329819 A1* 10/2021 Xu ......................... H05K 7/209

OTHER PUBLICATIONS

Cheng, Hao, "New Low-voltage Variable Frequency Control Cabinet", Sep. 25, 2018, Entire Document (translation of CN 207911184) (Year: 2018).*

* cited by examiner

FREQUENCY CONVERTER

TECHNICAL FIELD

The present disclosure relates to a field of frequency converter technology, and in particular to a frequency converter.

BACKGROUND

A frequency converter is a power control device that uses frequency conversion technology and microelectronics technology to control an alternating current (AC) motor by changing frequency of a power supply of the AC motor. The frequency converter is mainly composed of a rectification unit (AC to DC), a filter unit, an inverter unit (DC to AC), a braking unit, a drive unit, a detection unit, a microprocessing unit, etc. The frequency converter adjusts voltage and frequency of an output power supply by opening or shutting off an insulated gate bipolar transistor (IGBT) of the frequency converter, so that the frequency converter provides the required power supply voltage according to actual needs of the AC motor, which realizes a purpose of energy saving and speed regulation. In addition, the frequency converter has many protection functions, such as overcurrent protection, overvoltage protection, overload protection and etc. With continuous improvement of industrial automation, frequency converters are widely used now. A main circuit of the frequency converter can be roughly divided into two categories: a voltage-type main circuit and a current-type main circuit. A voltage-type frequency converter is a frequency converter that converts the DC of a voltage source into AC, the filtering of the DC loop is realized by a capacitor. A current-type frequency converter is a frequency converter that converts the DC of the current source into AC, and the filtering of the DC loop is realized by an inductor.

In the process of using the frequency converter, a large amount of heat is generated inside. Conventional frequency converters only dissipate heat through heat dissipating holes, which has low heat dissipation efficiency and poor heat dissipation effect. Moreover, external dust is easy to enter the frequency converter through the heat dissipating holes and damages internal electrical components, which shortens a service life of the frequency converter and is inconvenient to use.

SUMMARY

In views of the defects in the prior art, the present disclosure provides a frequency converter which solves problems that a conventional frequency converter has low heat dissipation efficiency and poor heat dissipation effect, and external dust is easy to enter the conventional frequency converter through the heat dissipating holes and damages internal electrical components, which shortens a service life of the conventional frequency converter and is inconvenient to use.

In order to achieve the above objects, the present disclosure provides a frequency converter. The frequency converter comprises a box body and a bottom box. A bottom portion of the box body is fixedly connected with a top portion of the bottom box. A top portion of a left side of the box body and a bottom portion of the left side of the box body are fixedly connected to a respective fan. A top portion of a left side of an inner wall of the box body and a top portion of the left side of the inner wall of the box body are fixedly connected to a respective annular plate. One end of an output shaft of each fan is fixedly connected to a rotating rod. One end of each rotating rod away from the fan passes through the box body and extends to an interior of the box body. Fan blades are disposed on a periphery of the one end of the rotating rod that extends to the interior of the box body and disposed in an interior of the annular plate. Heat dissipating holes are on a top portion of a right side of the box body and a bottom portion of the right side of the box body. A first heat dissipating sheet is fixedly disposed on a top portion of a rear side of the inner wall of the box body. The first heat dissipating sheet is close to a side of the heat dissipating holes. A heat conducting sheet is fixedly disposed on a bottom portion of the rear side of the inner wall of the box body. The heat conducting sheet is close to the side of the heat dissipating holes. Second heat dissipating sheets are fixedly connected to a right side of the heat conducting sheet. A top portion of a right side of the inner wall of the box body and a bottom portion of the right side of the inner wall of the box body are movably connected to a respective dust-proof net. The dust-proof nets are disposed close to a left side of the heat dissipating holes.

Optionally, a top portion and a bottom portion of one side of each dust-proof net away from the inner wall of the box body are threadedly connected to bolts. One end of each bolt close to a corresponding dust-proof net passes through the corresponding dust-proof net and the box body and extends to an exterior of the box body.

Optionally, one end of each bolt extends to the exterior of the box body is threadedly connected to a nut. The one end of each bolt is disposed close to the right side of the box body. Another end of each bolt away from the box body and close to a left side of the dust-proof net is fixedly connected to a cup nut.

Optionally, two sides of a top portion of an inner wall of the bottom box are fixedly connected to a respective electric telescopic rod. Two sliding rails are fixedly disposed on two sides of the inner wall of the bottom box. A movable plate is disposed between the two sliding rails and is slidably connected to two opposite sides of the two sliding rails.

Optionally, one end of an output shaft of each electric telescopic rod is fixedly connected to a top portion of the movable plate. Four corners of a bottom portion of the movable plate are fixedly connected to a respective pulley.

Optionally, through grooves matching the pulleys are provided on a bottom portion of the bottom box. Four corners of the bottom portion of the bottom box are fixedly connected to a respective supporting leg.

Optionally, one side of each supporting leg away from the bottom box is fixedly connected to a rubber pad. A front side of the box body is connected with a door through screws. A control panel is fixedly disposed on a front side of the door.

Optionally, a mounting plate is fixedly disposed on a rear side of a top portion of the box body. Mounting holes are disposed on two sides of the mounting plate.

Compared with the prior art, in the present disclosure, the top portion of the left side of the box body and the bottom portion of the left side of the box body are fixedly connected to the respective fan. The top portion of the left side of the inner wall of the box body and the top portion of the left side of the inner wall of the box body are fixedly connected to the respective annular plate. One end of the output shaft of each fan is fixedly connected to the rotating rod. One end of each rotating rod away from the fan passes through the box body and extends to the interior of the box body. Fan blades are disposed on the periphery of the one end of each rotating rod that extends to the interior of the box body and disposed in the interior of the annular plate. Heat dissipating holes are on the top portion of the right side of the box body and the bottom portion of the right side of the box body. The first heat dissipating sheet is fixedly disposed on the top portion of the rear side of the inner wall of the box body. The first heat dissipating sheet is close to the side of the heat dissipating holes. The heat conducting sheet is fixedly disposed on the bottom portion of the rear side of the inner wall of the box body. The heat conducting sheet is close to the side of the heat dissipating holes. The second heat dissipating sheets are fixedly connected to the right side of the heat conducting sheet. the top portion of the right side of the inner wall of the box body and the bottom portion of the right side of the inner wall of the box body are movably connected to the respective dust-proof net. The dust-proof nets are disposed close to a left side of the heat dissipating holes. Setting of the fans quickly discharges heat inside the frequency converter through the heat dissipating holes, which improves heat dissipation efficiency and heat dissipation effect. Setting of the dust-proof nets makes it difficult for external dust to enter the frequency converter and prolongs a service life of the frequency converter.

In the present disclosure, the top portion and the bottom portion of one side of each dust-proof net away from the inner wall of the box body are threadedly connected to the bolts. One end of each bolt close to the corresponding dust-proof net passes through the corresponding dust-proof net and the box body and extends to the exterior of the box body. One end of each bolt extends to the exterior of the box body is threadedly connected to the nut. The one end of each bolt is disposed close to the right side of the box body. Another end of each bolt away from the box body and close to the left side of the dust-proof net is fixedly connected to the cup nut. Setting of bolts and nuts facilitates an installation and disassembly of the dust-proof nets and facilitates cleaning of the dust-proof nets, which is convenient for operation.

In the present disclosure, two sides of the top portion of the inner wall of the bottom box are fixedly connected to the respective electric telescopic rod. Two sliding rails are fixedly disposed on two sides of the inner wall of the bottom box. The movable plate is disposed between the two sliding rails and is slidably connected to two opposite sides of the two sliding rails. One end of the output shaft of each electric telescopic rod is fixedly connected to the top portion of the movable plate. Four corners of the bottom portion of the movable plate are fixedly connected to a respective pulley. Through grooves matching the pulleys are provided on the bottom portion of the bottom box. Four corners of the bottom portion of the bottom box are fixedly connected to the respective supporting leg. One side of each supporting leg away from the bottom box is fixedly connected to the rubber pad. By setting of the pulleys, it is convenient to move the frequency converter, which saves manpower and is convenient to use. When there is no need to move the frequency converter, the pulleys are retracted into the bottom box, such that a stability of the frequency converter is not affected.

1—box body; 2—bottom box; 3—fan; 4—annular plate; 5—rotating rod; 6—fan blade; 7—heat dissipating hole; 8—dust heat dissipating sheet; 9—heat conducting sheet; 10—second heat dissipating sheet; 11—dust-proof net; 12—bolt; 13—nut; 14—cap nut; 15—electric telescopic rod; 16—sliding rail; 17—movable plate; 18—pulley; 19—through grooves; 20—supporting leg; 21—rubber pad; 22—door; 23—control panel; 24—mounting plate; and 25—mounting holes.

DETAILED DESCRIPTION

Technical solutions in the embodiments of the present disclosure will be clearly and completely described below in conjunction with the accompanying drawings in the embodiments of the present disclosure. Obviously, the described embodiments are only a part of the embodiments of the present disclosure, rather than all of the embodiments. Based on the embodiments of the present disclosure, all other embodiments obtained by those of ordinary skill in the art without creative work shall fall within the protection scope of the present disclosure.

Figure 1:
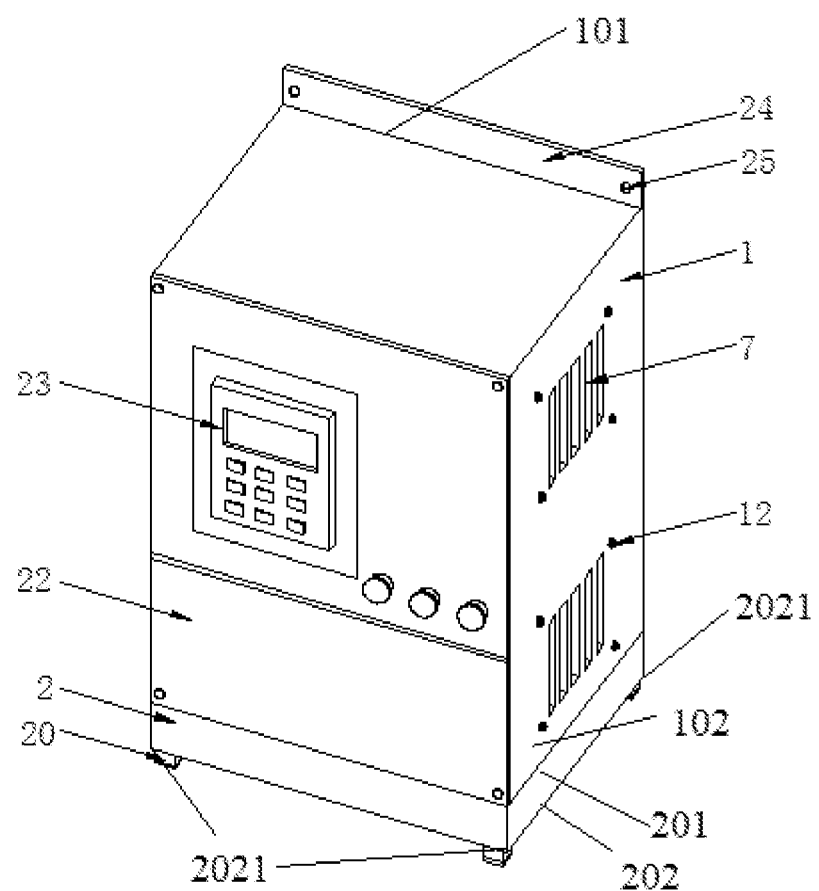
FIG. 1 is a schematic diagram showing a structure of the present disclosure.
Figure 2:
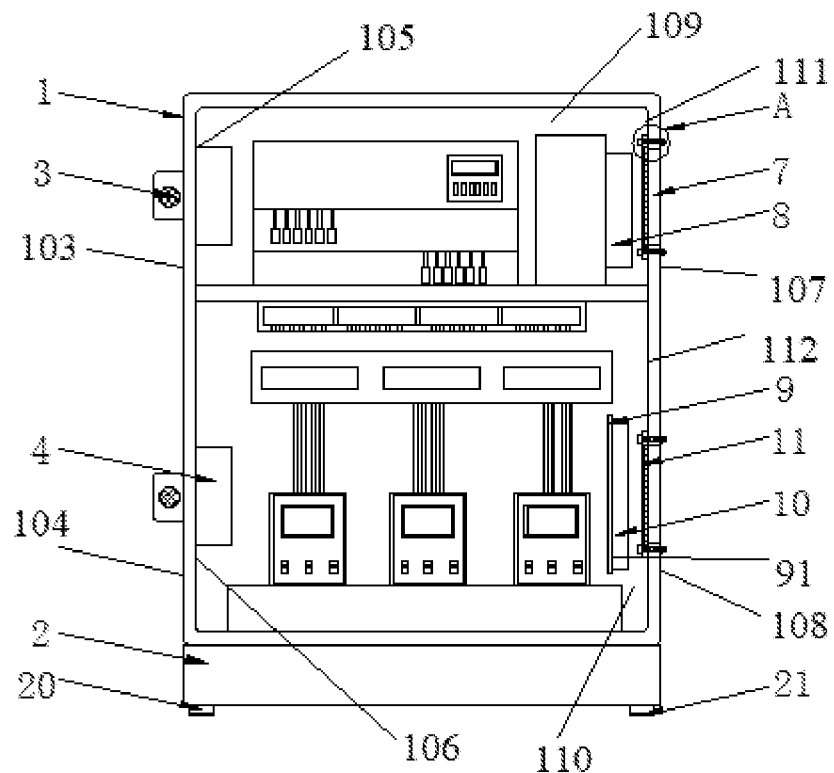
FIG. 2 is a cross-sectional view of the present disclosure.
Figure 3:
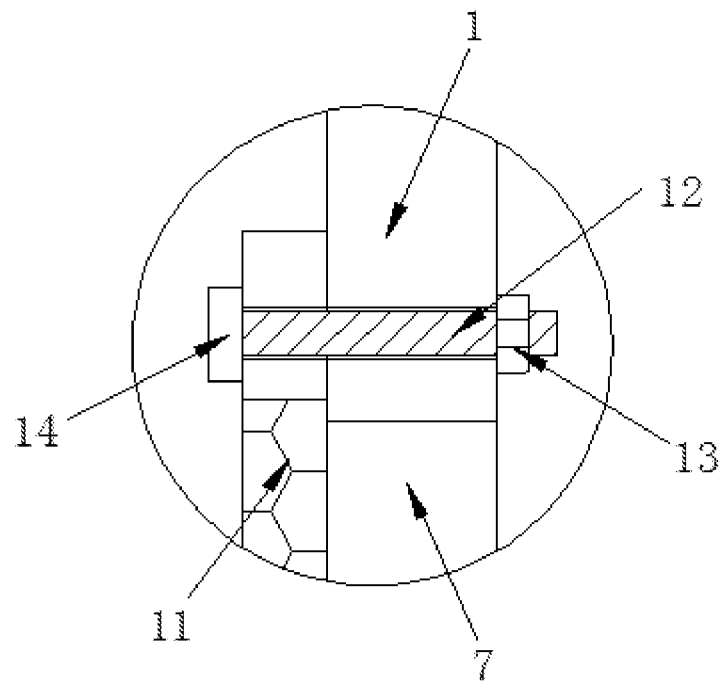
FIG. 3 is an enlarged view of area A shown in FIG. 2.
Figure 4:
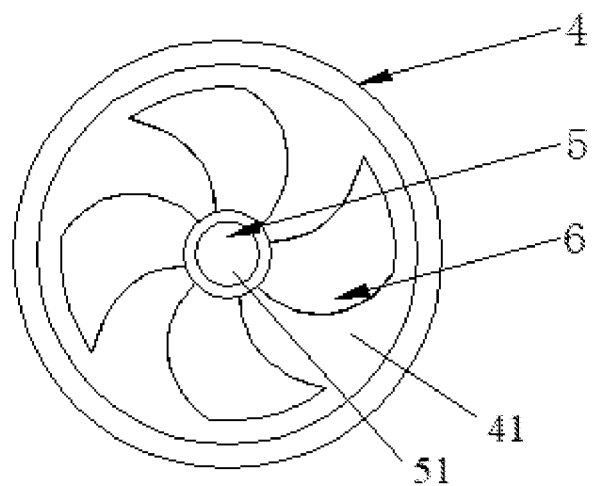
FIG. 4 is a cross-sectional view of fan blades of the present disclosure.
Figure 5:
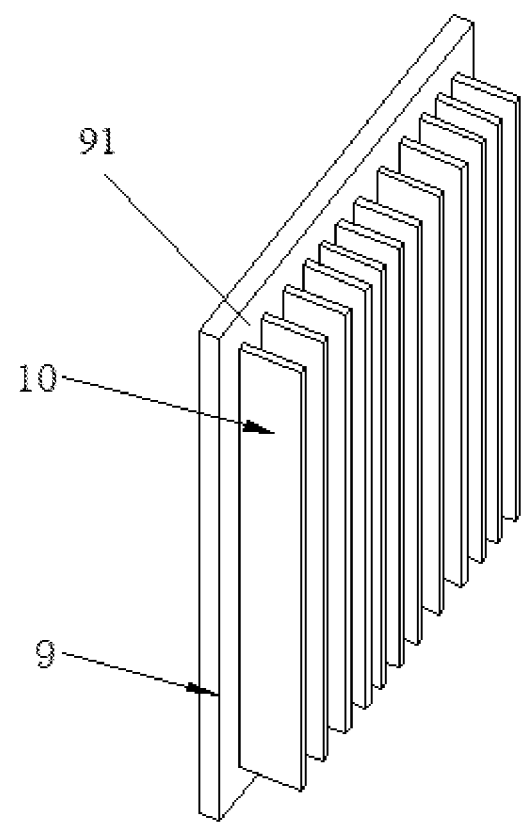
FIG. 5 is a perspective view showing structures of a heat conducting sheet and second heat dissipating sheets of the present disclosure.
Figure 6:
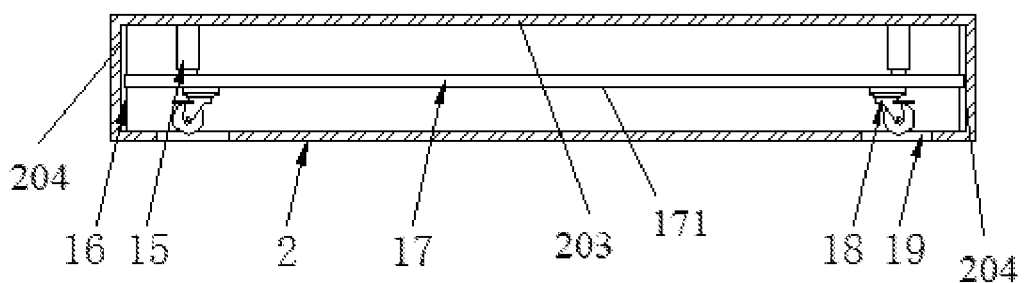
FIG. 6 is a cross-sectional view of a bottom box of the present disclosure.

As shown in FIGS. 1-6, the present disclosure provides a frequency converter. The frequency converter comprises a box body 1 and a bottom box 2. A mounting plate 24 is fixedly disposed on a rear side of a top portion of the box body 101. Mounting holes 25 are disposed on two sides of the mounting plate 24. By setting of the mounting plate 24 and the mounting holes 25, the frequency converter is easily installed with external components.

Through grooves 19 matching pulleys 18 are provided on a bottom portion of the bottom box 202. By setting of the through grooves 19, it is convenient for the pulleys 18 to extend or retract to the bottom box 2.

Four corners of the bottom portion of the bottom box 2021 are fixedly connected to a respective supporting leg 20. One side of each supporting leg 20 away from the bottom box 2 is fixedly connected to a rubber pad 21. Setting of the rubber pad 21 has an effect of damping the frequency converter. A front side of the box body 1 is connected with a door 22 through screws. By setting of screws, it is convenient to install and disassemble the door 22 and is convenient to repair electrical components disposed inside the box body 1. A control panel 23 is fixedly disposed on a front side of the door 22.

Two electric telescopic rods 15 are are fixedly connected to a top wall of the bottom box 203. The electric telescopic rods 15 are controlled by an external control mechanism. One end of an output shaft of each electric telescopic rod 15 is fixedly connected to a top portion of a movable plate 17. Two sliding rails 16 are fixedly disposed on two side walls of the bottom box 204. The movable plate 17 is disposed between the two sliding rails 16 and is slidably connected to two opposite sides of the two sliding rails 16. Four corners of a bottom portion of the movable plate 17 are fixedly connected to a respective pulley 18. Setting of the electric telescopic rods 15, the movable plate 17, and the pulleys 18 facilitates a movement of the frequency converter and saves manpower.

A bottom portion of the box body 102 is fixedly connected with a top portion of the bottom box 201. A top portion of a left side of the box body 103 and a bottom portion of the left side of the box body 104 are fixedly connected to a respective fan 3. The fans 3 are controlled by the external control mechanism. A top portion of a left side of an inner wall of the box body 105 and a bottom portion of the left side of the inner wall of the box body 106 are fixedly connected to a respective annular plate 4. One end of an output shaft of each fan 3 is fixedly connected to a rotating rod 5. One end of each rotating rod 51 away from the fan 3 passes through the box body 1 and extends to an interior of the box body 1. Fan blades 6 are disposed on a periphery of the one end of each rotating rod 51 that extends to the interior of the box body and disposed in an interior of the annular plate 41. Setting of the fans 3, the rotating rods 5 and the fan blades 6, facilitates the heat dissipation inside the box body 1.

Heat dissipating holes 7 are on a top portion of a right side of the box body 107 and a bottom portion of the right side of the box body 108. There are a large number of heat dissipating holes 7 provided om the box body 1, which improves the heat dissipation effect. A first heat dissipating sheet 8 is fixedly disposed on a top portion of a rear side of the inner wall of the box body 109. The first heat dissipating sheet 8 is close to a side of the heat dissipating holes 7. A heat conducting sheet 9 is fixedly disposed on a bottom portion of the rear side of the inner wall of the box body 110. The heat conducting sheet 9 is close to the side of the heat dissipating holes 7. Second heat dissipating sheet 10 are fixedly connected to a right side of the heat conducting sheet 91. The first heat dissipating sheet 8, the heat conducting sheet, and the second heat dissipating sheets 10 absorb heat generated by the frequency converter. A top portion of a right side of the inner wall of the box body 111 and a bottom portion of the right side of the inner wall of the box body 112 are movably connected to a respective dust-proof net 11. The dust-proof nets 11 are disposed close to a left side of the heat dissipating holes 7. Setting of the dust-proof nets 11 makes it difficult for external dust to enter the interior of the frequency converter, which extends the service life of the frequency converter.

A top portion and a bottom portion of one side of each dust-proof net 11 away from the inner wall of the box body 1 are threadedly connected to bolts 12. One end of each bolt 12 extends to the exterior of the box body 1 is threadedly connected to a nut 13. The one end of each bolt is disposed close to the right side of the box body 1. Setting of bolts 12 and nuts 13 facilitates an installation and disassembly of the dust-proof nets 11 and facilitates cleaning of the dust-proof nets 11, which is convenient for operation. Another end of each bolt 12 away from the box body land close to a left side of the dust-proof net is fixedly connected to a cup nut 14. One end of each bolt 12 close to a corresponding dust-proof net 11 passes through the corresponding dust-proof net 11 and the box body 1 in sequence and extends to an exterior of the box body 1.

When in use, the first heat dissipating sheet 8, the heat conducting sheet 9, and the second heat dissipating sheets 10 absorb heat generated by the frequency converter, and the fans 3 are turned on to drive the rotating rods 5 to rotate, and the rotating rods 5 drive the fan blades 6 to rotate, such that the heat generated by the frequency converter is quickly dissipated through the hat dissipating holes 7. The dust-proof nets close to one side of the heat dissipating holes prevent the external dust from entering into the box body 1. When disassembling and cleaning the dust-proof nets 11, the screws disposed on the door 22 are removed from the box body 1 and the door 22, so that the door 22 is removed from the box body 1. Then, the nuts 13 are removed from the bolts 12 and the bolts 12 are screwed to remove from the dust-proof nets 11, so that the dust-proof nets are removed from the box body for cleaning. After the cleaning is completed, the dust-proof nets are installed inside the box body 1 through the bolts 12 and nuts 13. When the electric telescopic rods 15 are turned on, the electric telescopic rods 15 drive the movable plate 17 to moves downward on the sliding rails 16, thereby driving the pulleys 18 to stretch out of the bottom box 2 through the through grooves 19, so that the frequency converter is able to be moved. The box body 1 is able to be connected to an outside through the mounting plate 24 and the mounting holes 25.

It should be noted that in the present disclosure, relational terms such as "first" and "second" are only used to distinguish one entity or operation from another entity or operation, and do not intended to limit actual relationships or order between these entities or operations. Moreover, the terms "include", "comprise" or any other variants thereof are intended to cover non-exclusive inclusion, so that a process, method, article, or device that includes a series of elements includes not only those elements, but also includes other elements, or also include elements inherent to this process, method, article or device.

Although the embodiments of the present disclosure are shown and described, those of ordinary skill in the art can understand that various changes, modifications, substitutions, and variations can be made based on these embodiments without departing from the principle and spirit of the present disclosure. The scope of the present invention is defined by the appended claims and their equivalents.

What is claimed is:

1. A frequency converter, comprising a box body and a bottom box; a bottom portion of the box body is fixedly connected with a top portion of the bottom box;
   wherein a top portion of a left side of the box body and a bottom portion of the left side of the box body are fixedly connected to a respective fan; a top portion of a left side of an inner wall of the box body and a bottom portion of the left side of the inner wall of the box body are fixedly connected to a respective annular plate; each fan of the respective fan is fixedly connected to a respective rotating rod; one end of each rotating rod of the respective rotating rod away from each fan of the respective fan passes through the box body and extends to an interior of the box body; fan blades are disposed on a periphery of the one end of each rotating rod of the respective rotating rod that extends to the interior of the box body and disposed in an interior of the respective annular plate; heat dissipating holes are on a top portion of a right side of the box body and a bottom portion of the right side of the box body; a first heat dissipating sheet is fixedly disposed on a top portion of a rear side of the inner wall of the box body; the first heat dissipating sheet is adjacent to the heat dissipating holes; a heat conducting sheet is fixedly disposed on a bottom portion of the rear side of the inner wall of the box body; the heat conducting sheet is adjacent to the side of the heat dissipating holes; second heat dissipating sheets are fixedly connected to a right side of the heat conducting sheet; a top portion of a right side of the inner wall of the box body and a bottom portion of the right side of the inner wall of the box body are movably connected to a respective dust-proof net; the respective dust-proof net is disposed adjacent to the heat dissipating holes.

2. The frequency converter according to claim 1, wherein each dust-proof net of the respective dust-proof net are threadedly connected to bolts; one end of each bolt of the bolts adjacent to the respective dust-proof net passes through the respective dust-proof net and the box body and extends to an exterior of the box body.

3. The frequency converter according to claim 2, wherein the one end of each bolt of the bolts extends to the exterior of the box body is threadedly connected to a nut; the one end of each bolt of the bolts is disposed adjacent to the right side of the box body; another end of each bolt of the bolts away from the box body and adjacent to a left side of the respective dust-proof net is fixedly connected to a cup nut.

4. The frequency converter according to claim 1, wherein electric telescopic rods are arranged on a top wall of the bottom box; two sliding rails are fixedly disposed on two side walls of the bottom box; a movable plate is disposed between the two sliding rails and is slidably connected to two opposite sides of the two sliding rails.

5. The frequency converter according to claim 4, wherein one end of an output shaft of each electric telescopic rod of the electric telescopic rods is fixedly connected to a top portion of the movable plate; and a bottom portion of the movable plate is fixedly connected to pulleys.

6. The frequency converter according to claim 5, wherein through grooves matching the pulleys are provided on a bottom portion of the bottom box; and four corners of the bottom portion of the bottom box are fixedly connected to a respective supporting leg.

7. The frequency converter according to claim 6, wherein one side of each supporting leg of the respective supporting leg away from the bottom box is fixedly connected to a rubber pad; the box body is connected with a door; and a control panel is fixedly disposed on the door.

8. The frequency converter according to claim 1, wherein a mounting plate is fixedly disposed on a rear side of a top portion of the box body, and mounting holes are on the mounting plate.

* * * * *